(12) United States Patent
Sieg

(10) Patent No.: US 11,382,208 B2
(45) Date of Patent: Jul. 5, 2022

(54) DEVICE FOR A VEHICLE FOR DETECTING AN ACTIVATION ACTION IN A DETECTION REGION

(71) Applicant: Huf Hülsbeck & Fürst GmbH & Co. KG, Velbert (DE)

(72) Inventor: Berthold Sieg, Bottrop (DE)

(73) Assignee: Huf Hülsbeck & Fürst GmbH & Co. KG, Velbert (DE)

( * ) Notice: Subject to any disclaimer, the term of this patent is extended or adjusted under 35 U.S.C. 154(b) by 37 days.

(21) Appl. No.: 17/101,238

(22) Filed: Nov. 23, 2020

(65) Prior Publication Data

US 2021/0160998 A1 May 27, 2021

(30) Foreign Application Priority Data

Nov. 27, 2019 (DE) .................. 10 2019 132 134.4

(51) Int. Cl.
| | |
|---|---|
| *H05K 1/02* | (2006.01) |
| *H05K 1/18* | (2006.01) |
| *H05K 1/11* | (2006.01) |
| *E05B 85/10* | (2014.01) |
| *E05B 81/76* | (2014.01) |
| *B60R 25/20* | (2013.01) |
| *B60R 25/01* | (2013.01) |

(52) U.S. Cl.
CPC .......... *H05K 1/0218* (2013.01); *E05B 81/77* (2013.01); *E05B 85/10* (2013.01); *H05K 1/115* (2013.01); *H05K 1/185* (2013.01); *B60R 25/01* (2013.01); *B60R 25/20* (2013.01); *E05Y 2400/86* (2013.01); *E05Y 2900/531* (2013.01); *H05K 2201/10098* (2013.01); *H05K 2201/10151* (2013.01)

(58) Field of Classification Search
CPC ................. H05K 1/0218; H05K 1/185; H05K 2201/10098; H05K 2201/10151; E05B 81/77; E05B 85/10; E05B 81/76
See application file for complete search history.

(56) References Cited

U.S. PATENT DOCUMENTS

| | | | | |
|---|---|---|---|---|
| 2010/0271049 | A1* | 10/2010 | Van Gastel | G01R 27/2605 324/679 |
| 2013/0311039 | A1* | 11/2013 | Washeleski | E05F 15/46 701/36 |
| 2017/0194960 | A1* | 7/2017 | Bextermoeller | G07C 9/00309 |
| 2018/0283843 | A1* | 10/2018 | Adams | E05B 81/77 |
| 2019/0071898 | A1* | 3/2019 | Beck | E05B 85/16 |

* cited by examiner

*Primary Examiner* — Sherman Ng
(74) *Attorney, Agent, or Firm* — Bret E. Field; Bozicevic, Field & Francis LLP

(57) ABSTRACT

The invention relates to a device (10) for a vehicle (1) for detecting an activation action in a detection region (51), and in particular for mounting on a vehicle part (5), in order to activate a function of the vehicle (1) depending on the detection, comprising:
- a multi-layer printed circuit board (20),
- at least one electrically conductive sensor element (31) for capacitive sensing in the detection region (51), wherein the sensor element (31) is arranged on the printed circuit board (20),
- at least two shielding elements (40) for shielding (41) for the sensing.

14 Claims, 8 Drawing Sheets

DEVICE FOR A VEHICLE FOR DETECTING AN ACTIVATION ACTION IN A DETECTION REGION

Figure 1:
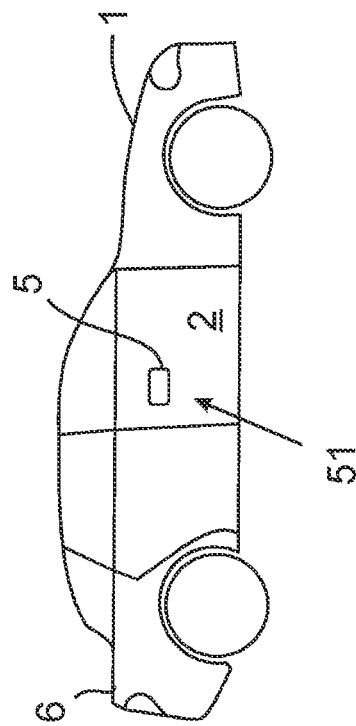

The present invention relates to a device for a vehicle for detecting an activation action in a detection region according to the type further defined in the preamble of claim 1. Furthermore, the invention relates to a door handle with the device and a method for detecting an activation action in a detection region of a vehicle.

It is known from the prior art that in vehicles, activation actions of a user can be used to activate functions of the vehicle. Such an activation action can be for example the approach of a hand to the door handle of the vehicle to unlock and/or lock the vehicle.

To detect this activation action, proximity sensors, such as capacitive sensors, are often integrated into the door handle of the vehicle.

However, it is often a problem that interferences can reduce the sensitivity and reliability of the detection. Causes for these interferences are e.g. further electronic and/or electric components of the door handle and/or electromagnetic fields. To shield these from the sensor, the use of shielding elements is also known. These can also be integrated into the door handle as electrically conductive surfaces and comprise a certain electric potential. However, in some cases this shielding may not be sufficient to reliably detect the activation action.

It is an object of the present invention to at least partially eliminate the disadvantages described above. In particular, it is an object of the present invention to further increase the sensitivity of the sensor and/or the reliability of the detection, to further improve the reduction of interferences and/or to provide the shielding by shielding elements more reliably and/or in an improved manner.

The preceding object is solved by the patent claims, in particular by a device with the features of the independent device claim, by a door handle with the features of the corresponding further device claim, and by a method with the features of the independent method claim.

Further features and details of the invention result from the respective dependent claims, the description and the figures. Features and details described in connection with the device according to the invention are of course also valid in connection with the door handle according to the invention as well as the method according to the invention, and vice versa, so that with regard to the disclosure of the individual aspects of the invention reference is or can always be made to each other.

To solve the above-mentioned object, a device for a vehicle for detecting an activation action in a detection region can be provided.

The device according to the invention may be suitable to be mounted on a vehicle part of the vehicle, preferably to create the detection region in the region of this vehicle part. The vehicle part is e.g. a door handle according to the invention, in which the device is received, or also a door or a lid or a bumper or a door sill of the vehicle. The detection of the (first) activation action can also be used to activate a (first) function of the vehicle depending on the detection. It may also be intended that at least a second activation action is detected in order to activate at least one (second or further) function of the vehicle, in which case the functions differ from each other.

For example, the activatable (first and/or at least second) function of the vehicle is at least one of the following:
locking of the vehicle,
unlocking of the vehicle,
initiating an opening and/or closing movement of a movable part of the vehicle, in particular a front or rear or side lid (such as a side door or a trunk lid) of the vehicle, wherein the movement is preferably motorized,
activating a vehicle lighting, initiating an authentication at the vehicle.

The first and the at least one second function can be different of the mentioned functions. Thus, it is possible, for example, that the detection of the first activation action triggers the activation of a different function of the vehicle than the detection of the second activation action. For example, the detection of an approach to a first outside of the door handle can trigger the locking and the detection of an approach to a second outside of the door handle can trigger the unlocking. The second outside can face a door handle recess and the first outside can face away from the door handle recess (or vice versa). This allows a comfortable and easy operation of the functions for a user of the vehicle.

In order to provide the detection by the device according to the invention in a compact and space-saving design, the device can comprise a multi-layer printed circuit board on which at least one—in particular electrically conductive—sensor element for capacitive sensing in the detection region is arranged. The sensor element can be suitable for capacitive sensing by the fact that it can provide an electric field (with appropriate electric control) and/or that it provides a variable capacitance with respect to the surroundings of the vehicle and/or in cooperation with an electric ground or counter-electrode of the vehicle, which is dependent on the surroundings. The electric control of the sensor element may be effected by a processing device (such as a microcontroller, integrated circuit or the like) of the device according to the invention, e.g. by repeated charge transfers.

The at least one sensor element can also comprise at least two sensor elements, which are then each designed for capacitive sensing in a separate detection region. Besides a first sensor element, a second sensor element or even further sensor elements can be provided. The respective sensor element can, for example, be designed as a sensor electrode. The sensor elements for capacitive sensing can be designed in different detection regions, wherein the detection regions can also be of different sizes. For example, the first sensor element can perform the sensing in a first detection region on the first outside and the second sensor element can perform the sensing in a second detection region on the second outside of the door handle. Accordingly, the different sensor elements can also be designed to detect different activation actions to activate different functions.

In order to improve the detection, at least two shielding elements can be provided for shielding for the sensing. In this case, it is in particular intended that the shielding elements are arranged at different layers of the printed circuit board. One of the shielding elements can be arranged at a first layer (of the different layers of the printed circuit board) and/or surround the sensor element (spatially) at the first layer in order to preferably provide the shielding in different directions.

The multi-layer design of the printed circuit board has the further advantage that the shielding elements can be arranged on several layers, thus enabling a three-dimensional arrangement of the shielding elements. Thus, the shielding can be adapted particularly flexibly to the detection region and the structure of the sensor element. Furthermore, the concrete three-dimensional design of the shielding elements on the printed circuit board allows the shielding to be adjusted in such a way that the different directions in which the shielding is to be applied are determined. Thus, the shielding can also be created three-dimensionally by the shielding elements, and according to a special advantage in a pot-shaped manner. Thus, the shielding can cause a limitation of the capacitive sensing to the detection region in a particularly reliable way.

Furthermore, the shielding elements can be arranged on the printed circuit board in such a way that a geometrical adaptation and in particular an adjustment of the shielding to the detection region of the sensor element is achieved. For example, the geometrical shape of the shielding is at least partially adapted to the geometrical shape of the detection region and/or corresponds to it at least partially.

The shielding can be provided by the shielding elements for the first sensor element, but optionally also additionally for at least one further sensor element of the device according to the invention. If the detection regions of the sensor elements differ, the corresponding shielding for the different sensor elements will also differ accordingly. For each of these different shieldings, separate shielding elements may be provided on the printed circuit board. It may also be provided that at least one of the shielding elements is used to generate the shielding for more than one of the sensor elements.

The shielding element at the first layer is also referred to as a first shielding element in the following for easier assignment, wherein a second shielding element at the second layer and/or a third shielding element at the third layer and/or a fourth shielding element at the fourth layer can also be provided.

The shielding elements can be electrically connected to each other across layers, thus forming a single shielding device. The respective shielding element is in particular provided in the form of an electrically conductive surface and/or conductor track, and the electric connection of the shielding elements is in particular provided as a through connection.

It can be provided that the sensor element and/or the shielding element and/or the (electric) ground on the printed circuit board is formed by conductor tracks and/or surfaces. These elements can comprise a thickness in the range of 0.1 mm to 0.9 mm, for example.

A multi-layer printed circuit board (so-called "multi-layer printed circuit board") can also have the advantage of increasing the packing density and/or improving the generation of electric and/or magnetic fields. In particular, if more than one detection region is provided, possibly for different sides of the device, and/or additionally a near-field communication is provided by the device, the use of several layers can simplify the alignment of the fields for the sensors and/or the shielding and/or the communication. The individual layers of the printed circuit board can also be called layers (engl.). The multi-layer printed circuit board can comprise at least or exactly 4 layers, which are firmly connected to each other.

The device according to the invention can be designed as a sensor and/or communication device. Thus, it is possible that the device and in particular the printed circuit board comprises several electronic components which serve both for the sensing in at least one detection region and for communication, in particular near-field communication. Thus, the device can provide a compact and individually manageable module that can comfortably provide several functions for a door handle. The communication can concretely concern a radio communication and/or a wireless communication, so that appropriate communication fields (electric and/or magnetic fields) are generated here. Therefore, the different fields for the sensor sensing and the communication can also interfere with each other, so that reliable shielding is then necessary.

The device according to the invention may be designed to provide at least one of the following functions:
 a detection of at least one activation action, such as an approach and/or a touch and/or a gesture and/or a tactile actuation by a user,
 a communication, preferably a radio communication, such as a near-field communication, in particular with a mobile device such as an ID transmitter and/or a smartphone and/or the like, preferably for authentication,
 an activation of a vehicle function, in particular a security-relevant vehicle function such as unlocking and/or locking, or a movement of a movable part of the vehicle, such as a lid, depending on the detection.

For example, the vehicle function can be activated, e.g. by an electric signal output of the device, if the detection is positive, i.e. the approach and/or touch and/or actuation and/or gesture has been detected. The mobile device may be separate from the vehicle and may be suitable for being carried by a person (e.g. in a bag).

Furthermore, the device according to the invention can be designed as a module which can be handled individually and which can be mounted as a single component on the vehicle and/or the vehicle part. For this purpose, the device may comprise positioning means such as recesses or geometric adjustments which enable a clear attachment to the vehicle. The positioning means can be designed simultaneously or alternatively as fixing means such as engaging elements or clips or adhesives. The device can be mounted on a part of the vehicle like a door and/or a door handle and/or a tailgate and/or a front lid. For mounting, the device can be fixed by the fixing means and positioned by the positioning means.

The device according to the invention can advantageously be integrated into a door handle of the vehicle, preferably the external door handle of the vehicle.

This means that the device can be designed to perform the communication and/or the detection in the region of the door handle. The device may be mounted for integration into the door handle in order to be mounted on the vehicle, in particular on a door of the vehicle, via the door handle.

It is also advantageous if the vehicle is designed as a motor vehicle, preferably a passenger car, in particular as a hybrid vehicle or as an electric vehicle, preferably with a high-voltage electric system and/or an electric motor and/or an internal combustion engine. It may also be possible for the vehicle to be designed as a fuel cell vehicle and/or semi-autonomous or autonomous vehicle.

Advantageously, the vehicle comprises a security system that enables authentication, for example, by communicating with a mobile device such as an identification transmitter (ID transmitter, electronic key) or smartphone. Depending on the communication and/or the authentication (the) at least one function of the vehicle can be activated. If the authentication of the mobile device is necessary for this purpose, the function can be a security relevant function, such as unlocking the vehicle or enabling an engine start. Thus, the security system can also be designed as a passive access system, which initiates the authentication and/or the activation of the function without active manual actuation of the mobile device, when the mobile device is detected approaching the vehicle. For this purpose, the security system repeatedly sends a wake-up signal which can be received by the mobile device when approaching the vehicle and then triggers the authentication. Likewise, the approach can be recognized by the fact that the activation action is detected by a device according to the invention. The function can also be an activation of a vehicle lighting and/or an actuation (opening and/or closing) of a lid (e.g. front or rear or side lid or door). For example, the vehicle lighting is automatically activated an approach is detected and/or the lid is activated when a user gesture is detected.

It may be possible that the sensor element—as a first sensor element—is provided on the printed circuit board for capacitive sensing in the detection region—as a first detection region. It may also be possible that a second sensor element for capacitive sensing is arranged in a second detection region on the printed circuit board, wherein the second detection region differs from the first detection region. The respective sensor element can be designed as a capacitive sensor, so that the sensing is based on the fact that a capacitance provided by the sensor element changes. The individual sensor element can be regarded as an electrode, which forms the variable capacitance in relation to the surroundings of the vehicle. A discrete counter-electrode does not necessarily have to be provided for this purpose. For example, an electric ground potential of the vehicle can also be regarded as a counter-electrode to form an imaginary capacitor with the variable capacitance. A first activation action in the first detection region then causes a capacitance change of the capacitance, which is provided by the first sensor element. A second activation action in the second detection region causes a corresponding capacitance change in the capacitance provided by the second sensor element.

The second sensor element can be at least partially congruent with the first sensor element. Furthermore, the second sensor element and the first sensor element can be arranged (offset to each other) at different layers of the printed circuit board. In addition to this arrangement (offset in axial direction) at different layers, the sensor elements can be positioned offset to each other (in lateral direction) at (within) the respective layer. The offset positioning thus means a different positioning of the sensor elements within the plane of the respective layer so that the sensor elements do not overlap. Thus, the sensor elements are congruent in themselves, but they are not congruent on top of each other. In this way, an influence of the first activation action on the sensing of the second sensor element (and/or vice versa) can at least be reduced.

The sensor elements can each comprise a substructure that repeats itself at fixed distances or fixed minimum distances, e.g. lines that are arranged at the fixed distances or minimum distances to each other. The offset positioning of the sensor elements (in lateral direction) is realized with an offset, which corresponds at maximum to this distance or minimum distance of the substructures (e.g. lines). Thus, the sensor elements are still positioned above each other (in axial direction), but within this distance or minimum distance (in lateral direction) offset from each other. This means that the substructures, in particular lines, of the second sensor element lie between the substructures, in particular lines, of the first sensor element (seen in axial direction). In particular, in case of a line structure of the sensor elements—i.e. the lines as substructure—it may be useful to select essentially half a distance or half a minimum distance for the offset. Thus, the substructures, in particular lines, of the second sensor element are located centrally between the substructures, in particular lines, of the first sensor element (seen in axial direction). In an imaginary top view of the sensor elements, the one sensor element would at least partially cover the other sensor element with a non-offset arrangement. However, this overlap is (at least partially) eliminated by the intended offset arrangement. For example, the sensor elements comprise the same line structure each, but the lines do not overlap due to the offset arrangement.

In addition, the second sensor element can comprise a longer extension than the first sensor element, thus providing the sensing in a larger second detection region. In case of a line structure of the sensor elements, the second sensor element thus comprises more lines than the first sensor element. Also, the second sensor element can be at least twice as long as the first sensor element. The sensor elements can be arranged on top of each other, at different layers of the printed circuit board. An offset arrangement of the sensor elements can reduce interference between the sensor elements. Since the second sensor element is longer than the first sensor element, only a part of the second sensor element is arranged above the first sensor element. Between the remaining non-overlapping part or the projecting part of the second sensor element and the layer of the printed circuit board with the first sensor element a ground surface and/or a shielding element can be provided in a flat manner.

This means that even an approach in the region adjacent to the first detection region does not or less affect the sensing in the second detection region, and/or an interference suppression of electronic components can be achieved.

It may optionally be possible that the shielding elements are arranged distributed at the layers in such a way that the shielding (generated by the shielding elements) limits the detection region in three directions orthogonal to each other and/or surrounds the detection region at least predominantly, in particular completely, in one plane, in particular so that the shielding is pot-shaped. It can be provided that the shielding is formed three-dimensionally by the shielding elements. This means that the influence of the shielding or the electric field generated by the shielding elements forms a three-dimensional geometrical shape around the sensor element. The concrete pot shape provided for this purpose means that the shielding surrounds the sensor element in at least one first plane and extends in another plane (unilaterally to the sensor element and flat) parallel to the at least one first plane. In other words, the sensor element is received by a pot of the shielding. Geometrically, the part of the shielding in the at least one first plane thus forms the wall and the part of the shielding in the further plane forms the bottom of the pot. The shielding elements themselves do not geometrically form a pot. The pot can be formed geometrically by the field generated by the shielding elements—i.e. the shielding. Such a shielding can also be provided for the second sensor element, i.e. for the shielding of the second detection region, and by which and/or further shielding elements are generated.

It is also advantageous if the shielding element surrounds the sensor element at least predominantly, in particular completely at the first layer. The (first) sensor element can be formed with a structured shape, in particular a line structure, at the first layer. The surrounding shielding element can comprise a substantially rectangular shape and thus surround the sensor element as a rectangular contour. The shielding element can correspond to a partial region of a ground surface with respect to shape and positioning, which can be provided at the second layer. Thus, this partial region of the ground surface can be congruent with the second layer and (laterally, i.e. with respect to the position in the plane of a layer) can be arranged in the same position as the shielding element at the first layer.

Furthermore, it may be possible that the sensor element is only predominantly, i.e. partially, surrounded by the shielding element (in particular at the first layer). For this purpose, the shielding element comprises an interruption in order to avoid in particular the occurrence of short-circuit currents, preferably by interaction with a communication means during operation for communication, in particular NFC communication. The interruption may be electrically isolated in order to avoid in particular such disturbances during communication.

A further advantage may be provided that one of the shielding elements at a second layer is (at least partially or completely) congruent with the sensor element at the first layer and in particular also congruently arranged and/or positioned identically (with respect to the lateral positioning, i.e. in the plane of the layer). In other words, in a top view, the sensor element at the first layer and the shielding element at the second layer may overlap (at least partially or predominantly or completely). The shielding element at the second layer can also be arranged in the identical position as the sensor element at the first layer, i.e. not offset, so that the shielding element completely covers the sensor element, in particular in the top view. Accordingly, the shielding element at the second layer can also be designed with the same geometrical design, in particular partial and preferably line structure, of the sensor element.

This shielding element then generates a shielding which reduces a disturbing influence of the electric ground at the second layer.

A line structure is to be understood as a geometric structure in which several branches (the lines) are arranged parallel to each other. The branches can (only) be connected by a common conductor track. Thereby, the branches can be guided orthogonal from the conductor track, if necessary in different directions. The lines can be arranged side by side as a partial structure with a certain distance or minimum distance to each other.

In a further possibility, it may be provided that an electric ground extends flat at the second layer adjacent to the shielding element at the second layer, in particular parallel and/or opposite to a region for the arrangement of electronic components at the first layer and/or to one of the shielding elements at a third layer. Alternatively or additionally, the ground may extend as a conductor surface (correspondingly flat) over the second layer, but may comprise a recess in a region opposite the sensor element at the first layer.

In this recess, the (second) shielding element can be arranged at the second layer, for example. On the other hand, the region of the ground opposite the region for the arrangement of electronic components can be continuous.

It is also conceivable that one of the shielding elements at a third layer extends flat and in particular unilaterally to the sensor element at the first layer in order to provide the shielding unilaterally. This shielding element can extend without a recess (i.e. continuously) with an essentially rectangular shape in relation to the sensor element and possibly also to the region for the arrangement of electronic components. In addition, a second sensor element can be provided at the fourth layer, so that the shielding element at the third layer can also serve to shield this second sensor element. In particular, the first and/or second layer can also be provided with shielding elements which also provide shielding in particular for the first sensor element.

It is also conceivable that the shielding elements are connected to each other at the different layers via through connections and are thus provided with equal potential. Through connections (engl. vias) offer in general a reliable way to electrically connect conductor tracks and/or surfaces at different layers. This allows for a three-dimensional arrangement of the shielding elements, but without the need to control the shielding elements at each layer separately. For example, the interconnected shielding elements can be connected to a processing arrangement and/or processing device for control at only one of the layers.

Another possibility is that the shielding elements are electrically separated (insulated) from each other at the different layers in order to comprise different electric potentials. Thus, it is possible to operate one of the shielding elements for active shielding and another one of the shielding elements for passive shielding. In contrast to the active shielding a fixed potential or ground potential is set at the shielding element for the passive shielding.

A further advantage may be that an (electronic) processing device is electrically connected to the shielding elements in order to operate the (or at least one of the) shielding elements to provide an active shielding ("Active Shield"), in which an electric potential of the (or the) shielding element(s) is adjusted depending on an electric potential of the sensor element. In other words, the electric potential of the shielding elements is adjusted to the potential of the sensor element. The processing device can thus be designed to actively adjust the electric potential of the shielding elements. The electric potential of the shielding elements can be adjusted according to the electric potential of the sensor element. It is also possible that only one or some of the shielding elements are operated to provide the active shielding and the others of the shielding elements comprise e.g. a fixed electric potential (like a ground potential). Concretely, the shielding element can be operated at the third layer to provide the active shielding (and the other shielding elements only optionally as well).

Optionally, the processing device can be arranged in a region, in particular at the first layer, of the printed circuit board which extends opposite to an electric ground surface, in particular at the second layer. Thus, it is intended that the processing device is shielded by the ground surface from at least one detection region in order to further improve the detection and/or to effect an interference suppression of the processing device.

Optionally, it may be possible that an (electronic) processing device is arranged on the printed circuit board and is electrically connected to the sensor element for charge transfers, in order to evaluate a variable electric capacitance, in particular on the basis of the charge transfers, and thereby control the capacitive sensing. In other words, the capacitive sensing and/or detection can be carried out by determining the variable capacitance by the processing device. The variable electric capacitance is provided in particular by the sensor element and is specific for a change in the detection region. Thus, this capacitive sensing can lead to the detection of the activation action. It is also possible that the processing device is connected to at least one further (second) sensor element of the device according to the invention in order to carry out and evaluate charge transfers for the capacitive sensing here as well. The processing device can also control the shielding elements, e.g. also by charge transfers.

It may be advantageous in the context of the invention if the processing device is designed to perform the detection of the activation action in such a way that an approach and/or a gesture of a user is detected on the basis of the evaluation of the capacitance. For this purpose, the determined capacitance can be compared e.g. with at least one threshold value and, if necessary, a temporal development of the capacitance can also be evaluated.

For example, it may be provided that the sensor element is formed at the first layer adjacent to the detection region, wherein in particular the first layer is provided as an outer layer of the printed circuit board. In this way, the sensor element can be used to provide the variable electric capacitance in such a way that the capacitance is dependent on the activation action in the detection region. The activation action is e.g. an approach of a body part of a user or the like. The approach can cause the electric field between the sensor element and the ground of the vehicle to change. Thus, triggered by the activation action, a change of the electric capacitance can be measured, since this changes the amount of charge transferred during the charge transfer. For example, the processing device performs several charge transfers, adds up the amount of charge transferred (e.g. by an integrator) and compares the charge accumulated in this way with a reference value. If this reference value is exceeded by the accumulated charge, this can be interpreted as a detection of the activation action. In this case it is advantageous if the reference value is adjusted again and again during operation by repeated reference measurements. This can prevent influences such as rain or snow from leading to false detection.

Furthermore, in the case of a device according to the invention, it may be provided that the shielding elements are arranged in such a way that any influence outside the detection region on the capacitive sensing is reduced by the shielding. For this purpose, the shielding elements can be arranged, for example, at at least two different layers of the printed circuit board, and thus provide the shielding laterally and axially for the sensor element. The shielding element at the first layer can surround the sensor element, and the shielding element at the second and/or third layer can be congruent and/or extend underneath the sensor element. In this way, a "pot-shaped" shielding for the different directions (lateral and axial) can be generated by the shielding elements.

It is also optionally conceivable that a communication means is arranged at the layers of the printed circuit board, and preferably extends over at least 2 or at least 4 or all of the layers and/or (laterally) spaced apart from the sensor and/or shielding element, in order to provide near-field communication with a mobile device. The near-field communication can be provided with the mobile device outside the vehicle. In this case the vehicle part can be designed as an external door handle. For example, the mobile device is designed as a smartphone, which then only needs to be held to the device or the external door handle for authentication to enable near-field communication. Alternatively, the door handle can also be designed as an internal door handle so that the near-field communication is carried out inside the vehicle.

The communication means is advantageously capable to provide or perform near-field communication such as NFC (engl. near-field communication) or RFID (engl. radio-frequency identification). The communication means is e.g. designed as an antenna, in particular an NFC antenna, which can be provided at least partially at some or all of the layers of the printed circuit board. The parts of the communication means at the different layers can be electrically connected to each other via through connections in order to provide a loop (e.g. NFC loop) at several layers. The communication means thus enables the device according to the invention to provide a communication function in addition to the sensor function. The communication means can be designed as a conductor track and, in particular, can comprise a constant distance to an electric ground surface and/or to the sensor and/or shielding element of the printed circuit board (in lateral direction). The communication means can extend along the outer edge of the printed circuit board or layer.

It may be intended that the communication means is used to perform authentication via the near-field communication, in particular triggered by the (successful) detection of the activation action. For example, a processing device and/or a control device of the vehicle recognizes that the detection was successful and triggers the authentication via the communication means. Thus, depending on the authentication, the function of the vehicle, in particular an unlocking and/or locking of the vehicle, can be activated. For example, a user carries the mobile device with him when he performs the activation action. By the activation action the user makes clear that he wants to activate the function of the vehicle. However, the function may be a security relevant function that requires the authentication of the user via the mobile device. The detection of the activation action by the device according to the invention can therefore trigger the authentication process, which is then also provided by the device by means of the communication, in particular near-field communication. The processing device and/or the control device of the vehicle can then also recognize the successful authentication and only then activate the function of the vehicle. For communication, the processing device and/or the control device of the vehicle can control a processing arrangement of the device like an NFC circuit.

It may be provided that a processing arrangement and/or a processing device are provided at the device according to the invention, which individually or together serve for evaluating the sensing and/or for detecting the activation action and/or for receiving and/or transmitting during communication—in particular near-field communication. The processing arrangement and the processing device can be designed as separate microcontrollers or integrated circuits (IC). For example, the processing device can be dedicated for detection and the processing arrangement can be used for near-field communication. It is also possible that the processing arrangement and the processing device together are designed as one IC.

It is also a possibility that the processing arrangement is part of the processing device, e.g. a microcontroller or IC. The processing arrangement and/or the processing device may comprise an interface to further vehicle electronics, in particular to a control device. For example, the processing device can output a signal to the vehicle electronics indicating that the detection has been successful. The reception of this signal can in turn trigger the authentication, which the vehicle electronics then initiates via a further interface with the processing arrangement.

Another object of the invention is a door handle for a vehicle. The door handle can be designed as an external or internal door handle, for example in the side, rear or front region of the vehicle. In this case, it is intended that the door handle—as the vehicle part—comprises a device according to the invention. Thus, the door handle in accordance with the invention comprises the same advantages as they have been described in detail with reference to a device in accordance with the invention.

Another object of the invention is a method for detecting an activation action in a detection region at a vehicle, in particular by a device according to the invention, in order to activate a function of the vehicle depending on the detection.

The following steps can be performed, preferably one after the other or in any order, wherein individual steps or all steps can also be performed repeatedly:

performing a capacitive sensing in the detection region by (at least) one electrically conductive sensor element at a multi-layer printed circuit board, generating a shielding for the sensing by at least two or three shielding elements on the printed circuit board.

Here it is intended that the shielding elements are arranged at different layers of the printed circuit board, wherein one of the shielding elements (geometrically) surrounds the sensor element at a first layer, so that the shielding is provided in different directions. Thus, the method according to the invention has the same advantages as those described in detail with respect to a device according to the invention.

Figure 2:
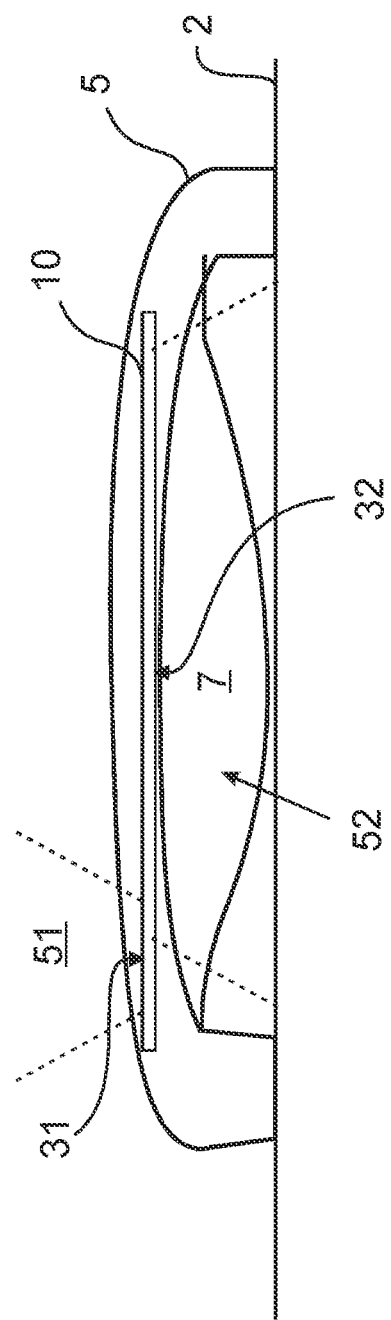
Figure 3:
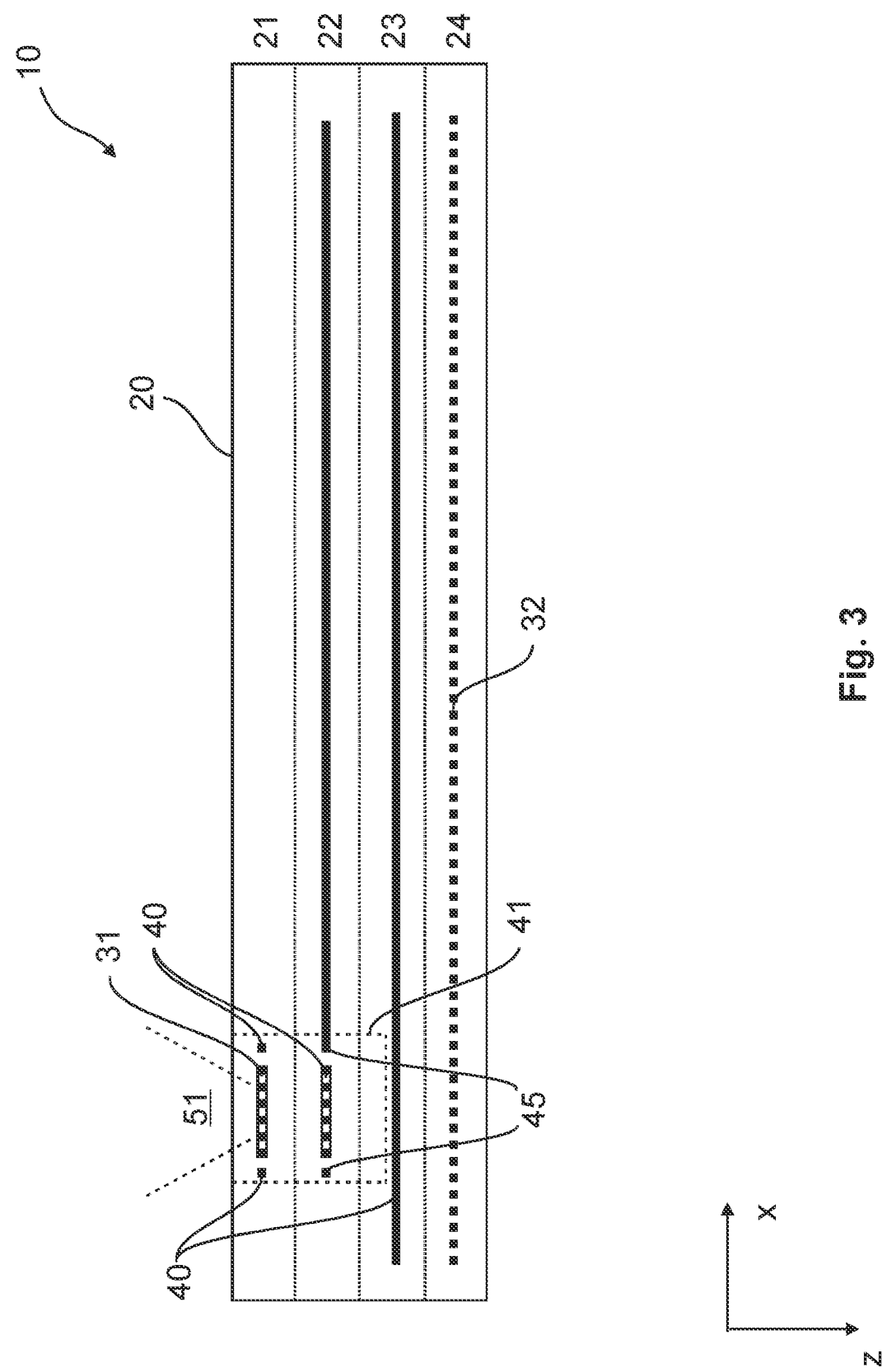

Further advantages, features and details of the invention result from the following description in which, with reference to the figures, embodiments of the invention are described in detail. The features mentioned in the claims and in the description may be individually or in any combination essential to the invention. The figures show:

FIG. 1 a schematic side view of a vehicle with a device according to the invention, FIG. 2 a schematic lateral sectional view of a door handle with an inventive device of the vehicle in FIG. 1, which corresponds to a top view of the vehicle, FIG. 3 an enlarged side view of the device according to the invention in

Figure 6:
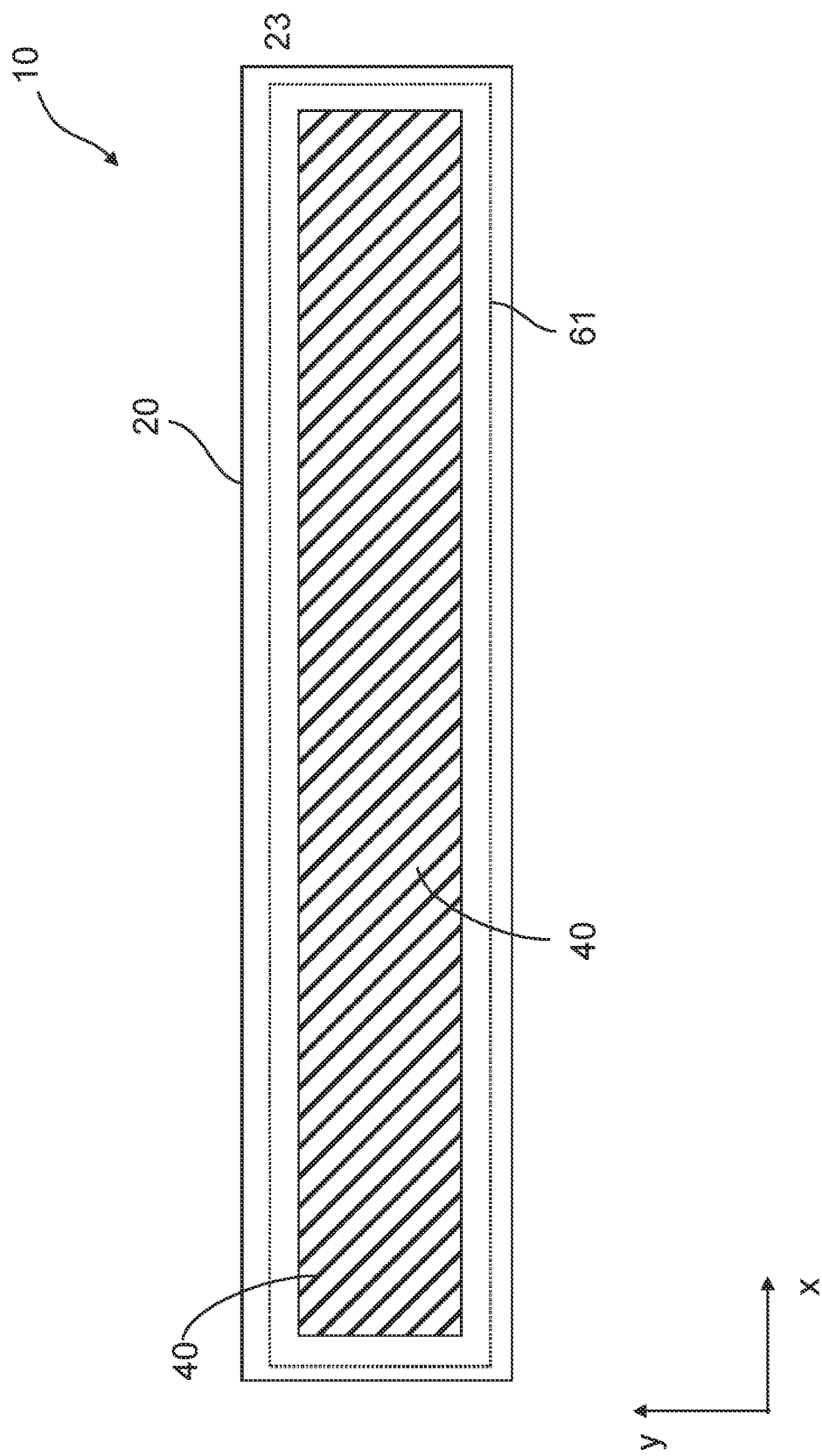
Figure 7:
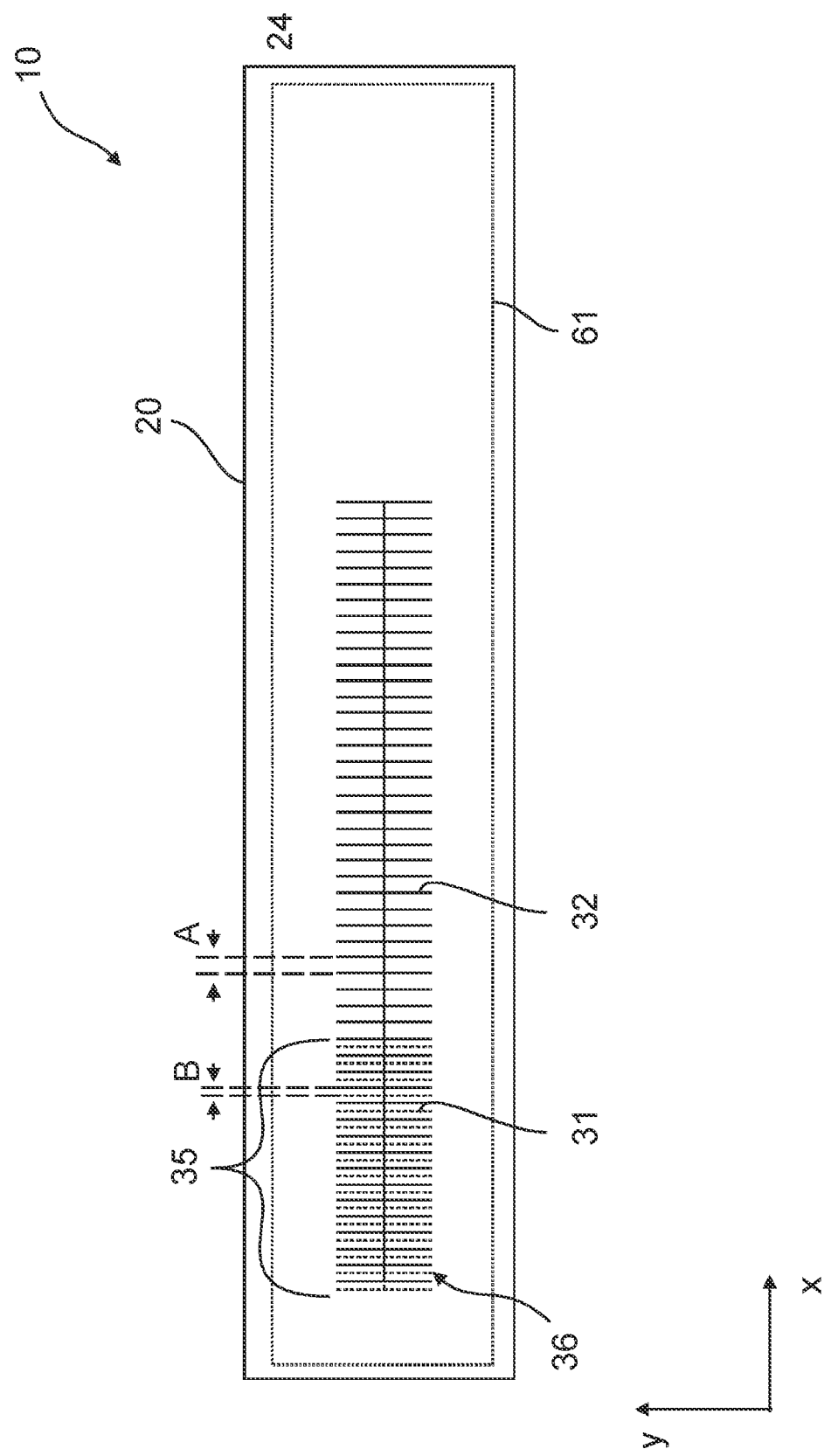
Figure 8:
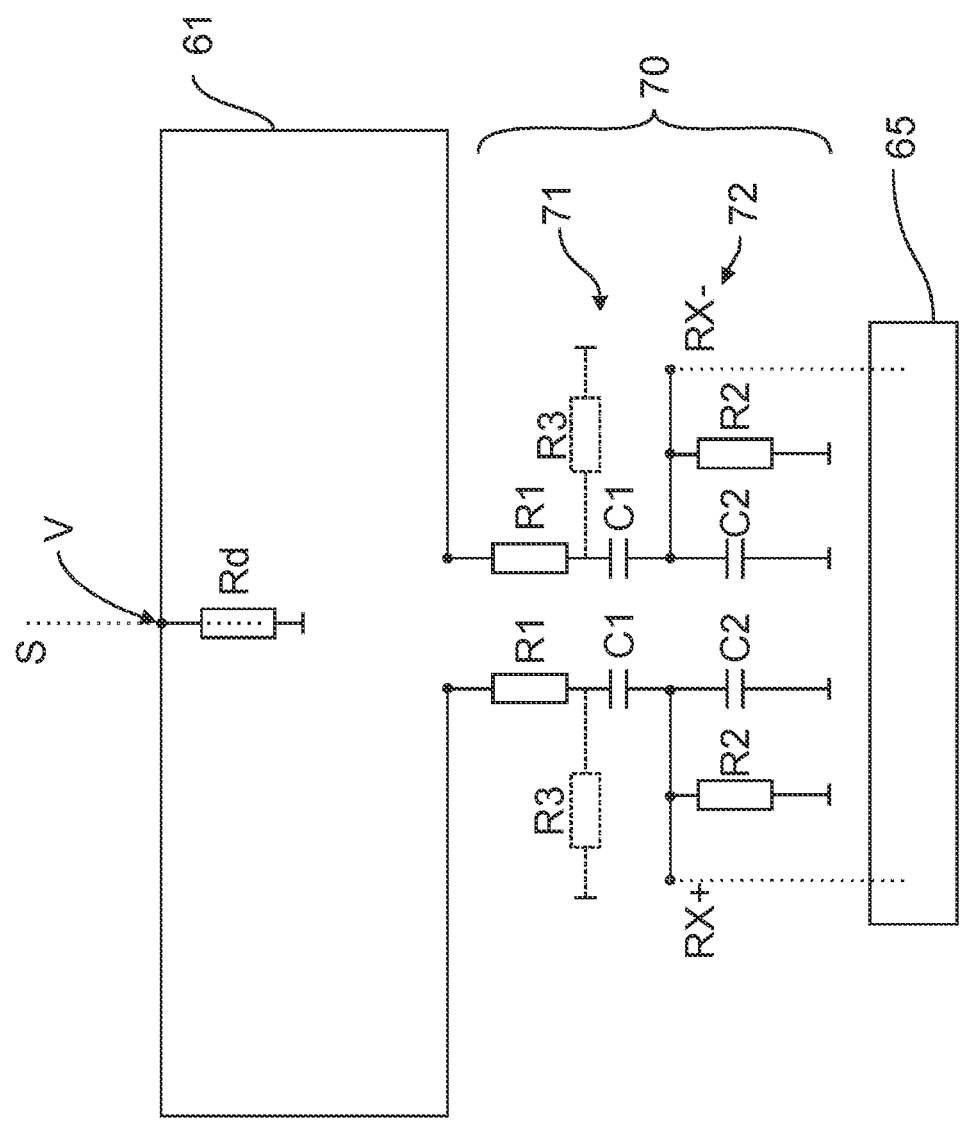

FIG. 2,

FIG. 4-7 schematic sectional views of various layers of the device according to the invention in FIGS. 2 and 3, FIG. 8 a schematic circuit diagram of parts of a device according to the invention.

In the following figures, identical reference signs are used for the same technical features even from different embodiments.

FIG. 1 shows a vehicle 1 with a door handle 5 according to the invention. The door handle 5 can form a vehicle part 5 which comprises a device 10 according to the invention.

The door handle 5 is fixed to a door 2 of the vehicle 1 to open the door 2 by a manual opening process. For this purpose, a user can engage into a door handle recess 7 shown in FIG. 2 and pull the door handle 5. The opening process requires that a lock on the door 2 is unlocked. For this purpose, the engagement into the door handle recess 7 as an activation action can be detected to activate an authentication and—if the authentication is successful—the unlocking as a function of the vehicle 1. A lock can be activated as a further function of the vehicle 1 if the approach into a detection region 51 is detected as an activation action. These are of course only examples of functions and activation actions. In case of a flush door handle 5 the function of the vehicle 1 can be e.g. the opening process itself, which is carried out automatically. It is also conceivable that a device 10 according to the invention is arranged in the rear or front region so that the function is the opening process of a lid 6 of the vehicle 1.

FIG. 1 shows the side view of the vehicle 1, where the orthogonal directions x and y are given. FIG. 2 shows a top view of the vehicle 1 in perspective according to the indicated orthogonal directions x and z. The representation in FIG. 2 (and also in FIG. 3) corresponds perspectively to a side view of the door handle 5 or of the device 10 according to the invention and the layers 21, 22, 23, 24. In FIGS. 4 to 7, however, sectional views of the device 10 are shown, which perspectively result from a top view of the device 10 and thus again correspond to the side view of the vehicle 1 in FIG. 1. The geometric relationships discussed in the context of this invention (e.g. the congruent design and the positioning of the shielding and sensor elements 40, 31 as well as the ground surface 45 of different layers 21, 22, 23, 24) can be described in relation to this imaginary top view on the device 10 according to the invention. This top view can be defined as a view in the axial direction z, which is orthogonal to the longest extension of the layers 21, 22, 23, 24 and to the lateral directions x and y, respectively.

As shown in FIG. 2, the door handle 5 comprises the device 10 according to the invention, which serves to detect an activation action in a detection region 51, and in particular via the door handle 5 for mounting on the door 5. By means of the device 10, a function of the vehicle 1 can be activated depending on the detection.

The device 10 may comprise a multi-layer printed circuit board 20 shown in FIG. 3 with further details, on which at least one electrically conductive sensor element 31 for capacitive sensing in the detection region 51 is arranged at a first layer 21 of the printed circuit board 20. The detection region 51 can be designed as a first detection region 51, which extends outside the vehicle 1 in the region of a first outside of the door handle 5. Likewise, a second detection region 52 can extend in the region of the door handle recess 7 or a second outside of the door handle 5. The second outside may face the door handle recess 7 and the first outside may face away from the door handle recess 7 (see FIG. 2). It is therefore possible that the sensor element 31—as a first sensor element 31—is provided for capacitive sensing in the detection region 51—as a first detection region 51—on the printed circuit board 20. Furthermore, a second sensor element 32 of the device 10 can also be provided at a fourth layer 24, which also performs a capacitive sensing in the second detection region 52. This enables the detection of different activation actions. The respective sensor element 31, 32 can be designed as a capacitive sensor so that the sensing is based on the fact that a capacitance provided by the respective sensor element 31, 32 changes. The individual sensor element 31, 32 can be regarded as an electrode, which forms the variable capacitance in relation to the surroundings of the vehicle 1. An electric ground potential of the vehicle 1 can be regarded as a counter-electrode to form an imaginary capacitor with the variable capacitance. A first activation action in the first detection region 51 then causes a capacitance change of the capacitance, which is provided by the first sensor element 31. A second activation action in the second detection region 52 correspondingly causes a capacitance change in the capacitance provided by the second sensor element 32.

To improve the detection, at least two shielding elements 40 can be used for shielding 41 for the sensing, as shown in FIG. 3. Here the shielding elements 40 are arranged at different layers 21, 22, 23, 24 of the printed circuit board 20, wherein one of the shielding elements 40 surrounds the (first) sensor element 31 at a first layer 21 to provide the shielding 41 in different directions x, y, z. FIG. 3 shows a "pot shape" of the shielding 41, which can be generated by the shown arrangement of the shielding elements 40. The shielding elements 40 can be arranged distributed at the layers 21, 22, 23, 24 in such a way that the shielding 41 limits the detection region 51 in the three orthogonal directions x, y, z, and in a plane x-y (shown in FIG. 4) surrounds the detection region 51 predominantly or completely.

Figure 4:
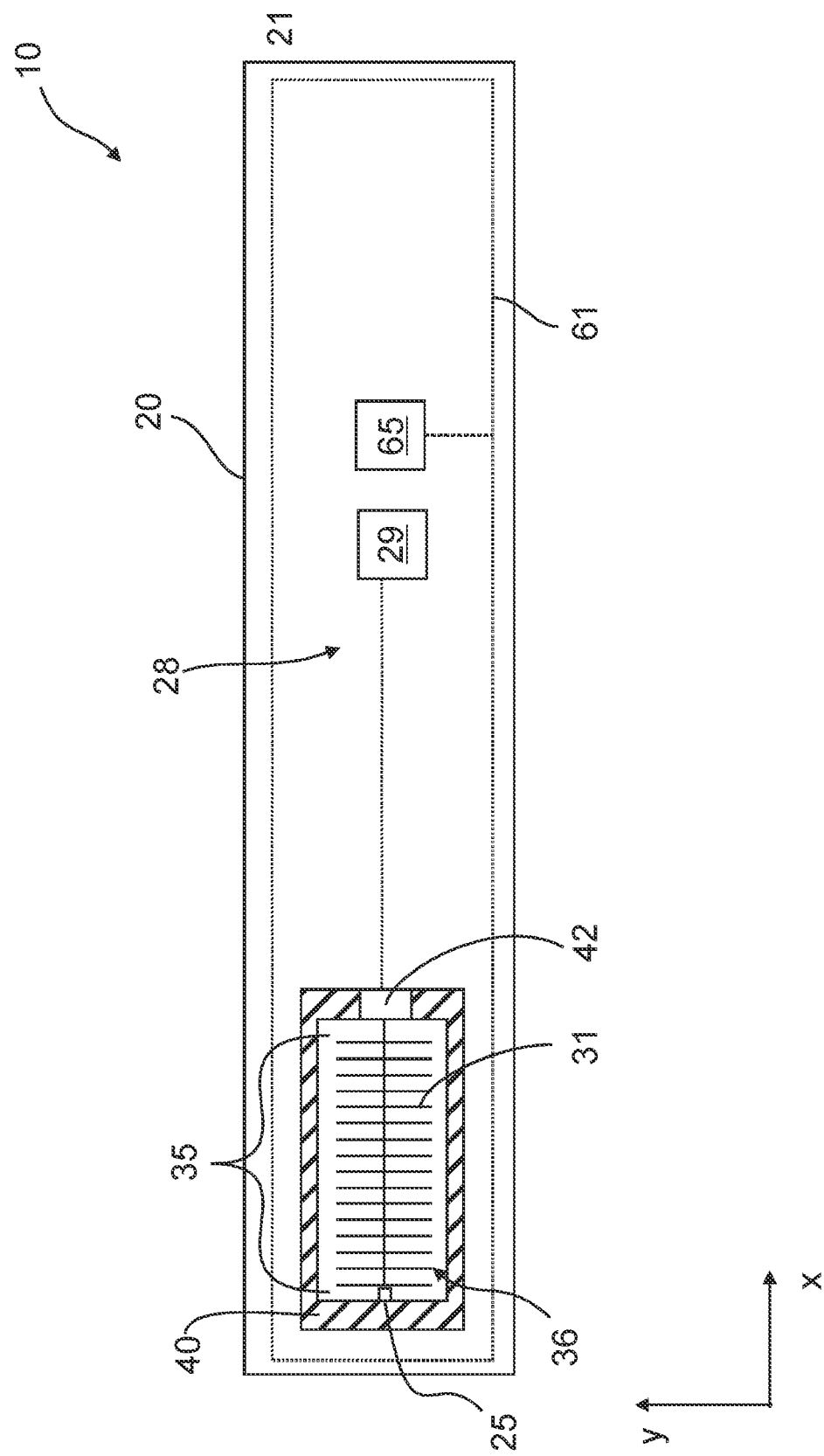

As shown in FIG. 4, the shielding element 40 at the first layer 21 can surround the sensor element 31 predominantly, and possibly even completely (not shown). FIG. 4 concretely shows that the shielding element 40 surrounds the sensor element 31 only predominantly, i.e. partially. For this purpose, the shielding element 40 comprises an interruption 42 in order to avoid the occurrence of short-circuit currents, in particular due to interaction with the communication means 61 during operation for communication, in particular NFC communication. The interruption 42 can be designed electrically isolated, in particular to avoid such disturbances during communication. This ensures that an electric field generated by the sensor element 31 is reliably directed into the detection region 51. In order to further improve the sensing in the detection region 51, one of the shielding elements 40 at a second layer 22 can be congruent with the sensor element 31 at the first layer 21 according to FIG. 5. Accordingly, the shielding element 40 at the second layer 22 can be arranged at least partially congruent and with the identical position as the sensor element 31 at the first layer. In this case, the identical position of course only refers to the directions x and y. This means that in an imaginary top view of the layer 22 in FIG. 5 and the layer 21 below, the sensor element 31 behind the shielding element 40 at the second layer 22 might not be visible anymore with partially transparent layers 21, 22, at least for the part where the shielding element 40 is congruent.

Figure 5:
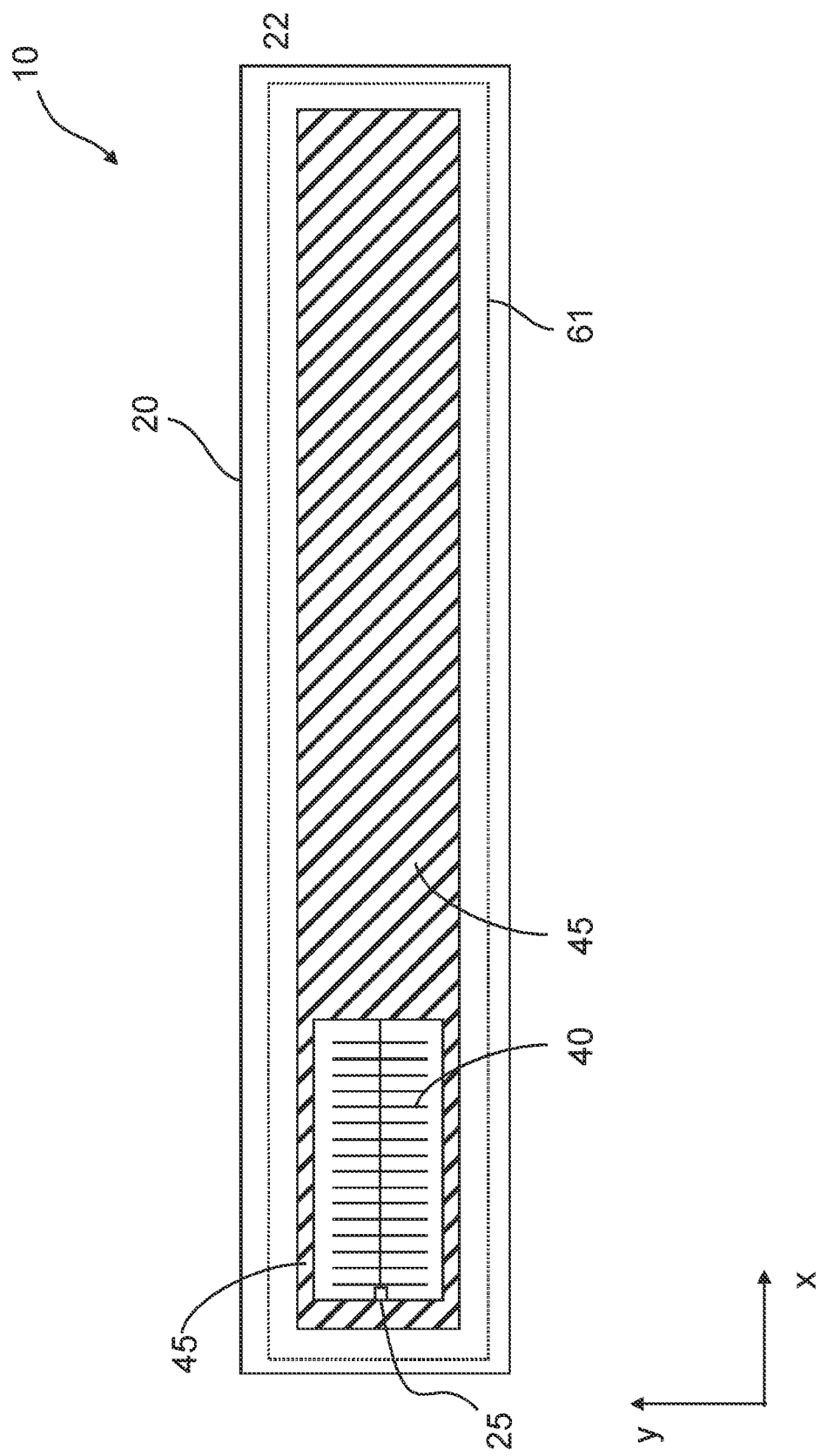

According to FIG. 5, an electric ground 45 can also extend flat at the second layer 22 adjacent to the shielding element 40 at the second layer 22, in particular parallel to a region 28 for the arrangement of electronic components at the first layer 21 and/or to one of the shielding elements 40 at a third layer 23. This ground surface 45 can comprise a recess for the sensor element 31 at the first layer or for the corresponding shielding element 40 at the second layer 22. In addition, the ground 45 can be used for interference suppression of the electronic components in the region 28 of the first layer 21. Furthermore, the region of the ground 45 around the recess can be congruent and/or in the identical position as the shielding element 40 at the first layer 21.

FIG. 6 shows that one of the shielding elements 40 at a third layer 23 extends flat and unilaterally to the sensor element 31 at the first layer 21 to provide the shielding 41 unilaterally. In addition, this shown shielding element 40 extends even further in direction x in order to simultaneously provide the shielding 41 for the second sensor element 32 in FIG. 7. The shielding element 40 and the second sensor element 32 thus comprise a longer extension than the first sensor element 31.

In FIG. 7 the sensor element 31 of the first layer 21 is shown in dashed lines to illustrate the position of the sensor element 31 below the fourth layer 24. In order to at least reduce the influence of the first activation action on the sensing of the second sensor element 32, it may be provided that the sensor elements 31, 32 are at least partially congruent to each other as shown in FIG. 7, but are positioned offset to each other. In other words, in addition to the offset arrangement at the different layers 21, 24 of the printed circuit board 20 (in axial direction z), an offset positioning of the sensor elements 31, 32 with respect to each other within the respective layer 21, 24 (in direction x) is also provided. Thus, the second sensor element 32 is at least partially congruent to the first sensor element 31, but is not congruent (or not in the identical position). In an imaginary top view of the sensor elements 31, 32 in axial direction z, the first sensor element 31 would cover the second sensor element 32 at least for a partial section if the positioning was not offset. However, this overlap is (at least partially) eliminated with the intended offset positioning. This offset positioning can also be understood to mean that the congruent regions 35 of the sensor elements 31, 32 are positioned offset to each other in the lateral direction x. As shown in FIG. 7 by the dotted line, the first sensor element 31 is offset by the offset B to the second sensor element 32 and therefore not covered. In concrete terms, the sensor elements 31, 32 each comprise the same line structure in the illustration, but the lines do not overlap due to the offset positioning. The lines are arranged as substructures 36 of the sensor elements 31, 32 at distance A from each other. The offset B is about or exactly half of the distance A.

In the examples shown here, the shielding elements 40 are connected to each other at the different layers 21, 22, 23, 24 via through connections 25, thus providing potential equalization. Alternatively, the shielding elements 40 at the different layers 21, 22, 23, 24 can also be electrically separated from each other to provide different electric potentials. A mixture of separate and connected shielding elements 40 is also conceivable. The connection via through connections 25 has the advantage, however, that only one electric connection of the shielding elements 40 with a processing device 29 is necessary to operate the shielding elements 40 to provide an active shielding 41, in which an electric potential of the shielding elements 40 is adjusted depending on an electric potential of the sensor element 31 and/or 32. The processing device 29 and/or a processing arrangement 65 for a near-field communication may be arranged in a region 28, in particular at the first layer 21 according to FIG. 4. This region may extend opposite a ground surface 45, in particular at the second layer 22.

Furthermore, FIGS. 4 to 7 show that a communication means 61 can be arranged at the layers 21, 22, 23, 24 of the printed circuit board 20 and preferably extend over all of the layers 21, 22, 23, 24 at a distance from the sensor and shielding element 31, 40. The communication means 61 is not shown here with its specific design at the respective layers 21, 22, 23, 24, but only schematically over a dotted line. The communication means 61 can be formed along this line, but at different layers 21, 22, 23, 24. In other words, the communication means 61 can be interrupted at one of the layers 21, 22, 23, 24 and can be continued as a conductor path again via a through connection 25 at this lateral position but at another layer 21, 22, 23, 24. The communication means 61 can be designed as a near-field antenna to provide near-field communication with a mobile device outside of the vehicle 1. This near-field communication can be triggered by the detection of the activation action to perform an authentication.

FIG. 8 shows an exemplary design for a communication means 61, in particular an NFC antenna, for near-field communication. The device 10 is therefore not only a sensor device 10 but also a communication device 10, in which the communication means 61 can be operated as a communication interface by a processing arrangement 65.

The communication means 61 is designed in the form of a loop or frame antenna (so-called loop) and can be used to transmit and/or receive signals for near-field communication with a mobile device. The coupling between the communication device 10 and the mobile device can take place at an operating frequency of the communication means 61 of 13.56 MHz. Accordingly, the communication means 61 can be designed to generate a magnetic field for communication with the mobile device and thus establish an inductive coupling with the mobile device. Therefore, the NFC antenna 61 can also be understood as an NFC coil. The communication means 61 can be advantageously designed as a conductor loop on the printed circuit board 20. However, the shape shown in FIG. 8 does not extend continuously at a single layer of the printed circuit board 20. This shape is rather interrupted at some locations by through connections 25 and, starting from this interruption, is continued at another layer. If the course of the communication means 61 at all layers 21, 22, 23, 24 would be brought together in one plane, the course shown in FIG. 8 could be obtained.

It is clear in FIG. 8 that the shown shape of the communication means 61 is geometrically symmetrical (in relation to the point V, through which the corresponding symmetry axis S can pass). This geometrical symmetry causes a reduction of interferences. At the same time, the communication means 61 can be operated in accordance with an electric balancing in which the control and/or signal routing by the processing arrangement 65 can be carried out symmetrically or differentially via the two branches at RX+ and RX− (in contrast to an operation in which one of the connections of the communication means 61 is connected to ground). It is therefore advantageous that an electric signal, in particular a voltage not equal to 0 volts, can be measured at both connections RX+ and RX−, which includes information from near-field communication. The voltage at the connections RX+ and RX− can be symmetrical and thus equal in amount. The processing arrangement 65 is designed as an NFC receiver or transceiver, for example.

In the symmetrical design shown, a virtual ground can be located exactly or essentially at the central point V of the communication means 61. This central point V can be located at the location of half the length or the center of the communication means 61, as shown in FIG. 8. Depending on the antenna design, it may be possible that no current flows through a tap at this point V with connection to ground in an ideal antenna. This point V is therefore referred to as virtual ground in the following.

Already by the geometrical and electric balancing, disturbing influences in the kind of disturbing immissions (electromagnetic radiation) can be reduced. Nevertheless, disturbing effects remain, which cause parasitic oscillating circuits of the communication means 61 to be excited. Harmonic and non-harmonic oscillations can occur, wherein the non-harmonic oscillations may be reduced by the processing arrangement 65 and/or by a filter arrangement 70. Nevertheless, the harmonic oscillations are still disturbing and can impair the reception in near-field communication by the communication means 61.

In order to further reduce disturbances in the reception of near-field communication due to interfering immissions, in particular EMC radiation, resistive attenuation can be provided at the position of the (ideal) virtual ground V. That means, at this position an ohmic resistor or an impedance can be used as damping resistor Rd, which connects the communication means 61 with an electric ground potential. This damping resistor Rd can be designed as a low ohmic resistor, for example in the region of 50 to 100 Ohm. Functionally, the resistive damping by the damping resistor Rd can comprise the effect that the disturbing oscillations are damped by the resistor Rd even if the position of the virtual ground at the communication means 61 changes due to the occurrence of the disturbances.

In addition, for further stabilization of the system it may be provided that the communication means 61 is at least predominantly arranged parallel to the outer edge and/or at a constant distance from the electric ground 45, in particular the ground surface 45, on the printed circuit board 20. The ground 45 is designed in FIG. 5 in the form of a conductor surface with ground potential. FIG. 5 also shows the constant distance between the ground surface 45 and the communication means 61. In this way, it can be ensured that a magnetic coupling of the communication means 61 to ground 45 is the same at any point.

In addition, a band-pass filter, preferably of 2nd order, in particular a so-called Wien filter, can be used for the filter arrangement 70, which comprises a particularly steep band-pass curve for improved filtering out of interference. The Wien filter is a specially switched RC band-pass, also known as the frequency determining circuit in a Wien-Robinson generator.

FIG. 8 shows that the filter arrangement 70 can be composed of at least one high-pass arrangement 71 (in particular a 1st order RC filter) and at least one low-pass arrangement 72 (in particular also as a 1st order RC filter). The high-pass and low-pass arrangements 71, 72 can be combined in pairs to form the band-pass filter, in particular a 2nd order RC filter. This band-pass filter, in particular the Wien filter, can be symmetrically provided in the filter arrangement 70.

Specifically, a resistor R1 and a capacitor C1 can be provided in serial connection. Optionally, a further resistor R3 is provided, which forms an additional voltage divider with R1. Furthermore, a resistor R2 and a capacitor C2 can be connected in parallel.

Furthermore, FIG. 8 shows that the described filter arrangement 70 comprises the band-pass filter symmetrically for the RX+ and RX− connections. A possible value for the respective resistor R1 is in the range from 1 to 10 kOhm, for the respective resistor R3 between 1 and 5 kOhm, for the respective capacitor C1 between 1 and 20 pF, for the respective resistor R2 between 100 and 500 Ohm and for the respective capacitor C2 between 10 and 40 pF. Thus, at least one band-pass filter can be provided by the filter arrangement 70, which causes a significant attenuation of signals of the communication means 61 in the range of e.g. 100 to 160 MHz.

The above explanation of the embodiments describes the present invention exclusively in the context of examples. Of course, individual features of the embodiments can be freely combined with each other, if technically reasonable, without leaving the scope of the present invention.

LIST OF REFERENCE SIGNS

1 vehicle
2 door
5 door handle, vehicle part
6 tailgate
7 door handle recess
10 device, sensor and/or communication device
20 printed circuit board
21 first layer
22 second layer
23 third layer
24 fourth layer
25 through connection
28 region for electronic components
29 processing device
31 sensor element, first sensor element
32 second sensor element
35 congruent regions
36 partial structure, line structure
40 shielding element
41 shielding 42 interruption
45 ground
54 detection region, first detection region
52 second detection region
61 communication means, antenna, NFC loop
65 processing arrangement
70 filter arrangement
71 high-pass arrangement
72 low-pass arrangement
x first direction, lateral direction
y second direction, lateral direction
z third direction, axial direction
21, 22, 23, 24 layers
A distance, minimum distance
B offset
C capacitor
R resistor
Rd damping resistor
RX connection
V virtual ground
S symmetry axis

The invention claimed is:

1. A device for a vehicle for detecting an activation action in a detection region in order to activate a function of the vehicle depending on the detection, comprising:
a multi-layer printed circuit board,
at least one electrically conductive sensor element for capacitive sensing in the detection region, wherein the sensor element is arranged on the printed circuit board, and
at least two shielding elements for shielding for the sensing,
wherein:
the shielding elements are arranged at different layers of the printed circuit board, wherein one of the shielding elements surrounds the sensor element at a first layer in order to provide the shielding in different directions; and
the shielding elements are distributed at the layers in such a way that the shielding limits the detection region in three directions orthogonal to each other and surrounds the detection region at least predominantly in one plane.

2. The device according to claim 1, wherein the shielding element surrounds the sensor element at least predominantly at the first layer.

3. The device according claim 1, wherein one of the shielding elements at a second layer is congruent with the sensor element at the first layer.

4. The device according to claim 3, wherein an electric ground extends flat at the second layer adjacent to the shielding element at the second layer.

5. The device according to claim 1, wherein one of the shielding elements at a third layer extends flat and unilaterally to the sensor element at the first layer in order to provide the shielding unilaterally.

6. The device according to claim 1, wherein the shielding elements are connected to one another at the different layers via through connections and are thus provided with equal potential.

7. The device according to claim 1, wherein the shielding elements are electrically separated from each other at the different layers in order to comprise different electric potentials.

8. The device according to claim 1, wherein a processing device is electrically connected to the shielding elements in order to operate the shielding elements to provide an active shielding, in which an electric potential of the shielding elements is adjusted depending on an electric potential of the sensor element.

9. The device according to claim 1, wherein a processing device is arranged on the printed circuit board and is electrically connected to the sensor element for charge transfers in order to evaluate a variable electric capacitance on the basis of the charge transfers and thereby provide the capacitive sensing.

10. The device according to claim 9, wherein the processing device is designed to perform the detection of the activation action in such a way that at least an approach or a gesture of a user is detected on the basis of the evaluation of the capacitance.

11. The device according to claim 9, wherein the sensor element is formed at the first layer adjacent to the detection region, wherein the first layer is provided as an outer layer of the printed circuit board to provide the variable electric capacitance via the sensor element in such a way that the capacitance is dependent on the activation action in the detection region.

12. The device according to claim 1, wherein a communication means is arranged at the layers of the printed circuit board.

13. A door handle for a vehicle which comprises a device according to claim 1 as the vehicle part.

14. A method for detecting an activation action in a detection region at a vehicle in order to activate a function of the vehicle depending the detection, wherein the following steps are carried out:
performing a capacitive sensing in the detection region by an electrically conductive sensor element at a multi-layer printed circuit board, and
generating a shielding for the sensing by at least two shielding elements on the printed circuit board,
wherein:
the shielding elements are arranged at different layers of the printed circuit board, wherein one of the shielding elements surrounds the sensor element at a first layer so that the shielding is provided in different directions; and
the shielding elements are distributed at the layers in such a way that the shielding limits the detection region in three directions orthogonal to each other and surrounds the detection region at least predominantly in one plane.

* * * * *